US008080738B2

(12) United States Patent
Morgan

(10) Patent No.: US 8,080,738 B2
(45) Date of Patent: Dec. 20, 2011

(54) PRINTED CIRCUIT HAVING GROUND VIAS BETWEEN SIGNAL VIAS

(75) Inventor: Chad W. Morgan, Woolwich Township, NJ (US)

(73) Assignee: Tyco Electronics Corporation, Berwyn, PA (US)

( * ) Notice: Subject to any disclaimer, the term of this patent is extended or adjusted under 35 U.S.C. 154(b) by 14 days.

(21) Appl. No.: 12/572,102

(22) Filed: Oct. 1, 2009

(65) Prior Publication Data

US 2011/0081809 A1 Apr. 7, 2011

(51) Int. Cl.
*H05K 1/16* (2006.01)

(52) U.S. Cl. ........................................................ 174/260

(58) Field of Classification Search .................. 174/260, 174/250; 361/792, 803, 793, 794, 795
See application file for complete search history.

(56) References Cited

U.S. PATENT DOCUMENTS

| | | | | |
|---|---|---|---|---|
| 5,331,514 | A * | 7/1994 | Kuroda | 361/760 |
| 6,641,411 | B1 | 11/2003 | Stoddard et al. | |
| 7,217,889 | B1 | 5/2007 | Parameswaran et al. | |
| 2006/0228912 | A1 * | 10/2006 | Morlion et al. | 439/65 |

* cited by examiner

*Primary Examiner* — Timothy J Thompson
*Assistant Examiner* — Roshn Varghese

(57) ABSTRACT

A printed circuit includes a substrate having a pair of opposite sides. A signal via extends through at least one of the sides and at least partially through the substrate between the sides. Aggressor vias extend through at least one of the sides and at least partially through the substrate between the sides. The aggressor vias are arranged in a pattern around the signal via. Linear paths are defined between the signal via and the aggressor vias. At least some of the aggressor vias are arranged along the substrate directly adjacent the signal contact. Ground vias extend through at least one of the sides and at least partially through the substrate between the sides. The ground vias are arranged around the signal via. At least one ground via is positioned along each linear path between the signal via and each of the aggressor vias that is directly adjacent the signal via.

6 Claims, 5 Drawing Sheets

A
118
125
110
119
108
168
166
114
121
102
106
104
100
116
123
112
117
A1

PRINTED CIRCUIT HAVING GROUND VIAS BETWEEN SIGNAL VIAS

BACKGROUND OF THE INVENTION

The subject matter described and/or illustrated herein relates generally to printed circuits, and more particularly, to the arrangement of vias within a printed circuit.

Printed circuits, sometimes referred to as "circuit boards", are used with a wide variety of electrical connectors. For example, electrical connectors are often used to interconnect two printed circuits together. Printed circuits may also be used, for example, as backplanes of electrical connectors or as midplane circuits between two electrical connectors. The design of printed circuits is becoming increasingly complex. Such increased complexity may be caused by factors such as, for example, increasing data rates of signals conveyed by printed circuits, increasing numbers of input/output signals per printed circuit, decreasing sizes of printed circuits, increasing numbers of layers within printed circuits, increasing printed circuit thicknesses, and/or the like. Such factors may lead to an increasing density of vias within printed circuits.

Because of the increases in the density of vias within printed circuits, vias that transmit signals are experiencing increased amounts of signal degradation, such as impedance discontinuities, crosstalk, and/or the like. Crosstalk occurs when signals being transmitted by adjacent signal vias interfere with each other. For example, signal vias are sometimes arranged within a printed circuit in differential pairs. Interference between the signal vias of adjacent differential pairs may generate crosstalk. Crosstalk may lead to increased signal noise, which may make it more difficult to correctly interpret the signal. Signal degradation problems may be particularly noticeable at higher signal speeds. In current higher speed electrical systems, a via arrangement for mating with an electrical connector, sometimes referred to as a "footprint" of the printed circuit, may be the largest source of signal degradation within the system. Accordingly, there is a need for a printed circuit footprint having a reduced signal degradation.

BRIEF DESCRIPTION OF THE INVENTION

In one embodiment, a printed circuit includes a substrate having a pair of opposite sides. A signal via extends through at least one of the sides and at least partially through the substrate between the sides. Aggressor vias extend through at least one of the sides and at least partially through the substrate between the sides. The aggressor vias are arranged in a pattern around the signal via. Linear paths are defined between the signal via and the aggressor vias. At least some of the aggressor vias are arranged along the substrate directly adjacent the signal contact. Ground vias extend through at least one of the sides and at least partially through the substrate between the sides. The ground vias are arranged around the signal via. At least one ground via is positioned along each linear path between the signal via and each of the aggressor vias that is directly adjacent the signal via.

In another embodiment, an electrical connector includes a housing, a signal contact held by the housing, and aggressor contacts held by the housing. The aggressor contacts are arranged in a pattern around the signal contact. Linear paths are defined between the signal contact and the aggressor contacts. At least some of the aggressor contacts are arranged along the housing directly adjacent the signal contact. Ground contacts are held by the housing. The ground contacts are arranged around the signal contact. At least one ground contact is positioned along each linear path between the signal contact and each of the aggressor contacts that is directly adjacent the signal contact.

In another embodiment, a printed circuit includes a substrate having a pair of opposite sides. A pair of signal vias extends through at least one of the sides and at least partially through the substrate between the sides. The signal vias are arranged in a differential signal pair. Aggressor vias extend through at least one of the sides and at least partially through the substrate between the sides. The aggressor vias are arranged in differential aggressor pairs that are arranged in a pattern around the differential signal pair. Linear paths are defined between each of the signal vias of the differential signal pair and each of the aggressor vias of each differential aggressor pair. At least some of the differential aggressor pairs are arranged along the substrate directly adjacent the differential signal pair. Ground vias extend through at least one of the sides and at least partially through the substrate between the sides. The ground vias are arranged around the differential signal pair. At least one ground via is positioned along each linear path between the signal vias of the differential signal pair and the aggressor vias of each of the differential aggressor pairs that is directly adjacent the differential signal pair.

DETAILED DESCRIPTION OF THE INVENTION

Figure 1:
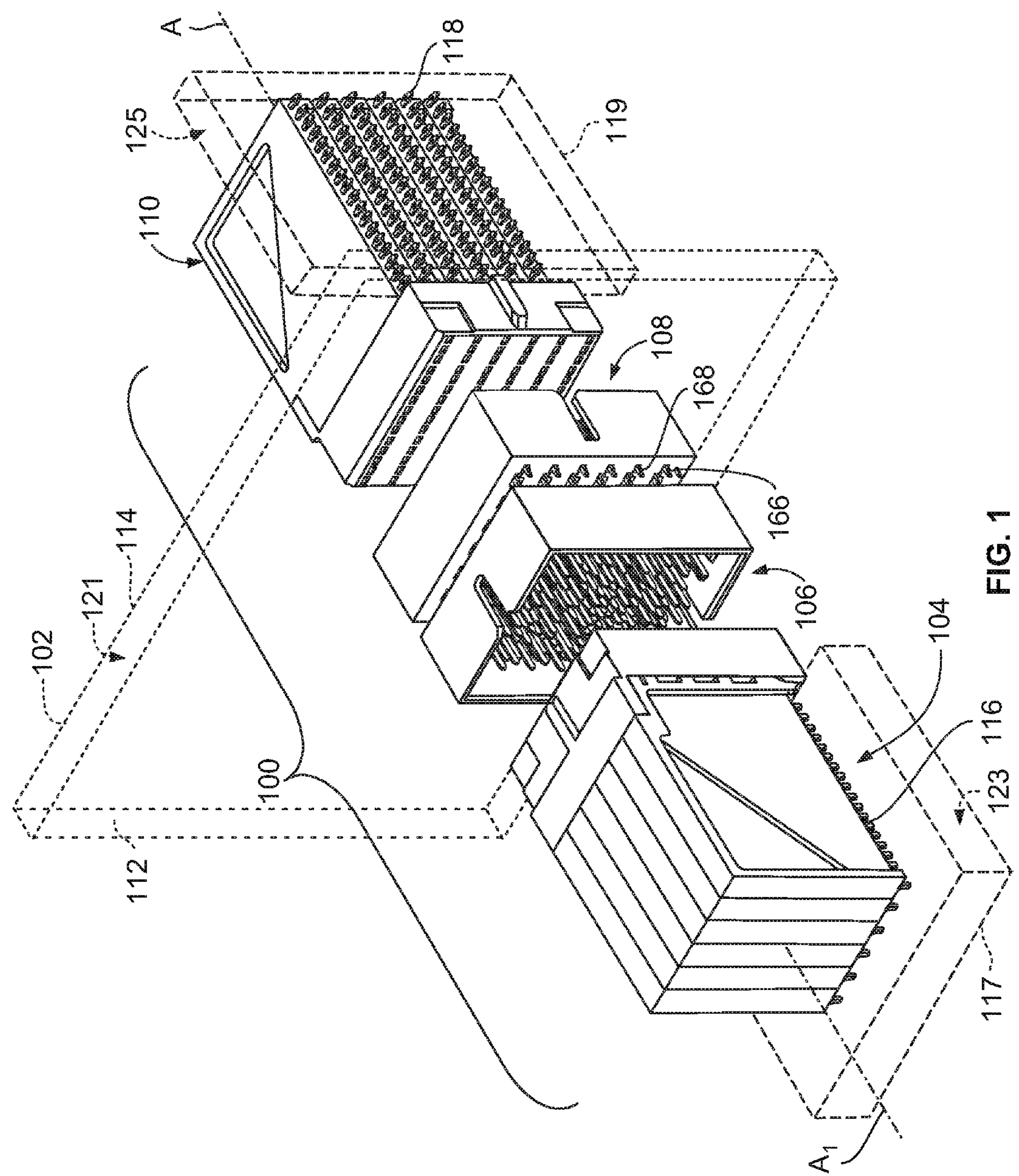
FIG. 1 is a perspective view of an exemplary embodiment of a connector assembly.

FIG. 1 is a perspective view of an exemplary embodiment of a connector assembly 100. The connector assembly 100 is mounted on a midplane printed circuit 102, which is shown in phantom lines in FIG. 1 for clarity. The connector assembly 100 includes a receptacle connector 104, a header connector 106, a header connector 108, and a receptacle connector 110. The receptacle connector 104 and the header connector 106 are mounted on a side 112 of the midplane printed circuit 102. The header connector 108 and the receptacle connector 110 are mounted on a side 114 of the midplane printed circuit 102 that is opposite the side 112. The receptacle connector 104 and the header connector 106 electrically connect to the header connector 108 and the receptacle connector 110 through the midplane printed circuit 102.

The receptacle connector 104 includes a mounting interface 116. The receptacle connector 104 is mounted on a printed circuit 117 at the mounting interface 116. Similarly, the receptacle connector 110 is mounted on a printed circuit 119 at a mounting interface 118 thereof. The printed circuits 117 and 119 are shown in phantom lines in FIG. 1 for clarity. The connector assembly 100 includes a longitudinal axis $A_1$ that extends from the receptacle connector 104 through the receptacle connector 110. In the exemplary embodiment, the header connectors 106 and 108 are oriented such that the header connectors 106 and 108 are rotated ninety degrees with respect to one another about the longitudinal axis $A_1$. The receptacle connectors 104 and 110 are also rotated ninety degrees with respect to one another about the longitudinal axis $A_1$. When electrically connected together through the midplane printed circuit 102 and the header connectors 106 and 108, the receptacle connectors 104 and 110 form an orthogonal connection between the printed circuits 117 and 119. Alternatively, the connectors 104, 106, 108, and 110 may connect the printed circuits 117 and 119 together in any other orientation relative to each other than orthogonal. For example, the connectors 104, 106, 108, and 110 may each be relatively oriented about the longitudinal axis $A_1$ such that the printed circuits 117 and 119 extend approximately parallel to each other when connected.

As used herein, the term "printed circuit" is intended to mean any electric circuit in which the conducting connections have been printed or otherwise deposited in predetermined patterns on and/or within an electrically insulating substrate. The midplane printed circuit 102, the printed circuit 117, and the printed circuit 119 include respective substrates 121, 123, and 125. Each of the substrates 121, 123, and 125 may be a flexible substrate or a rigid substrate. The substrates 121, 123, and 125 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 121, 123, and/or 125 is a rigid substrate fabricated from epoxy-glass, which is sometimes referred to as a "circuit board". Each substrate 121, 123, and 125 may include any number of layers.

Figure 2:
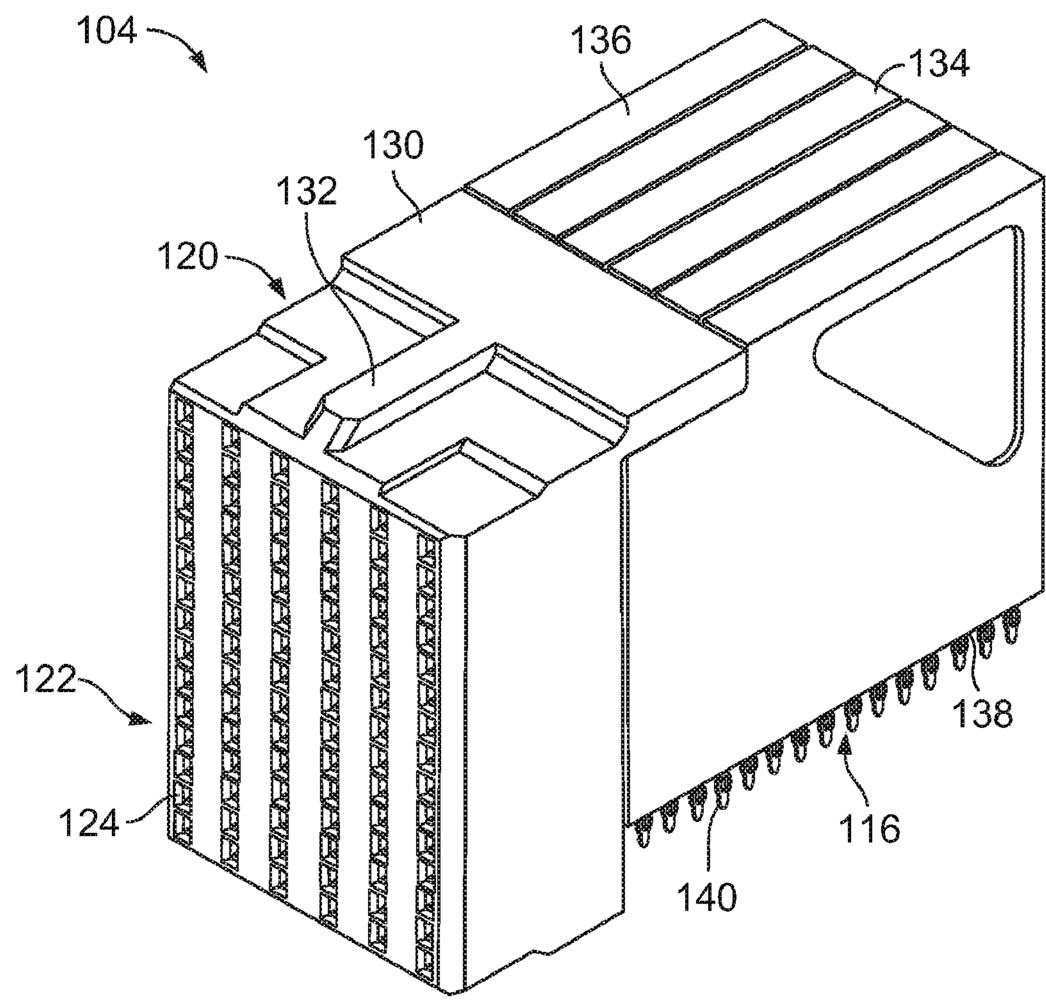
FIG. 2 is a perspective view of an exemplary embodiment of one of the receptacle connectors shown in FIG. 1.
Figure 5:
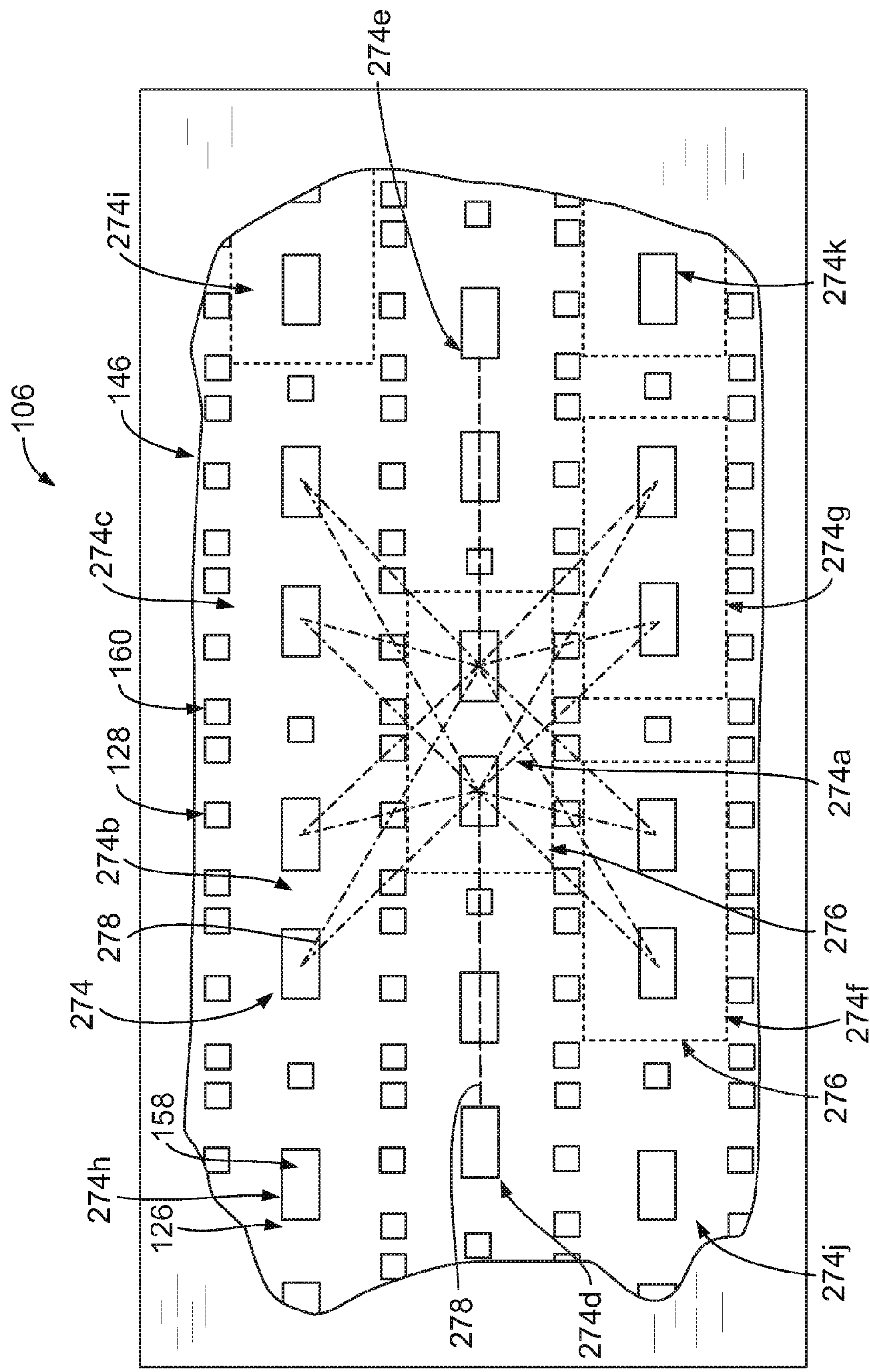
FIG. 5 is a plan view of a portion of an exemplary embodiment of a mounting end of the header connector shown in FIG. 3.

FIG. 2 is a perspective view of an exemplary embodiment of the receptacle connector 104. The receptacle connector 104 includes a dielectric housing 120. The housing 120 includes a mating face 122 having a plurality of contact channels 124 extending therein. The contact channels 124 are configured to receive signal contacts 126 (FIGS. 3 and 5) and ground contacts 128 (FIGS. 3 and 5) from the header connector 106 (FIGS. 1 and 5). The receptacle connector 104 includes a shroud 130 that extends rearwardly from the mating face 122. The housing 120 includes one or more guide ribs 132 to orient the receptacle connector 104 for mating with the header connector 106.

The housing 120 holds a plurality of contact modules 134. Each contact module 134 holds contacts and conductive paths that connect the receptacle connector 104 to the header connector 106 and the printed circuit 117. Specifically, each contact module 134 includes a lead frame (not shown) that is overmolded and encased in a dielectric housing 136. The housing 136 has a forward mating end (not shown) that is received in the receptacle connector housing 120 and a mounting edge 138 configured for mounting to the printed circuit 117 (FIG. 1). The mounting edges 138 of the contact modules 134 combine to define the mounting interface 116 of the receptacle connector 104. The lead frame of each contact module 134 includes mating contacts (not shown) that extend outwardly from the mating end of the housing 136. The mating contacts extend within corresponding ones of the contact channels 124. When the connectors 104 and 106 are mated together, each mating contact engages a corresponding signal or ground contact 126 and 128 (FIGS. 3 and 5), respectively, of the header connector 106 that is received within the corresponding contact channel 124. The lead frame of each contact module 134 includes mounting contacts 140 that extend outwardly from the mounting edge 138 of the housing 136. The mounting contacts 140 engage the printed circuit 117 to electrically connect the receptacle connector 104 to the printed circuit 117.

In an exemplary embodiment, the mounting interface 116 of the receptacle connector 104 is substantially perpendicular to the mating face 122 such that the receptacle connector 104 interconnects electrical components that are substantially at a right angle to each other. Alternatively, the mounting interface 116 extends at any other angle (such as, but not limited to, parallel) relative to the mating face 122 for interconnecting electrical components at any angle other than a right angle, such as, but not limited to, parallel.

In the exemplary embodiment, the receptacle connectors 104 and 110 are optionally substantially identical to one another. The receptacle connector 110 will therefore not be described in more detail herein.

Figure 3:
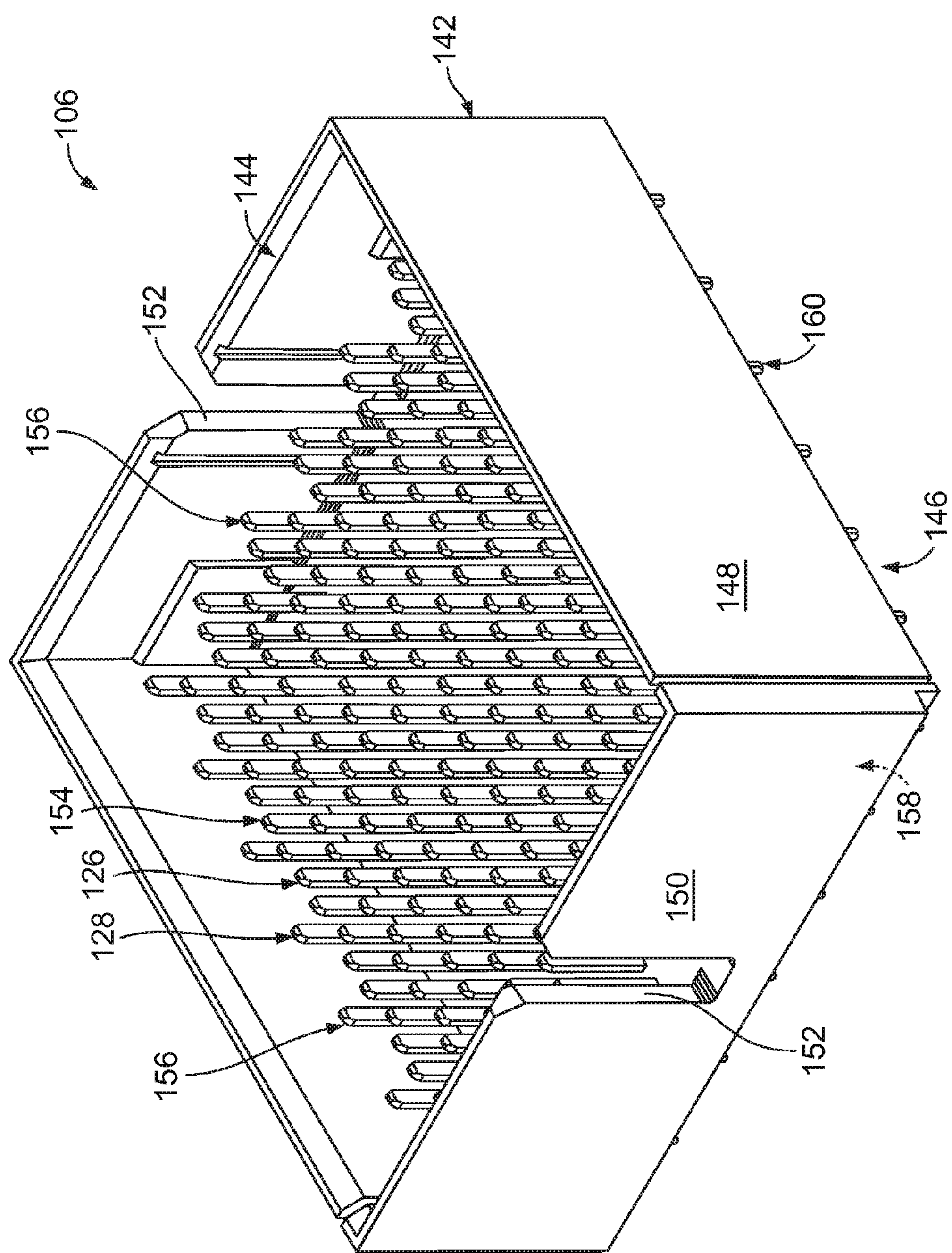
FIG. 3 is a perspective view of an exemplary embodiment of one of the header connectors shown in FIG. 1.
Figure 4:
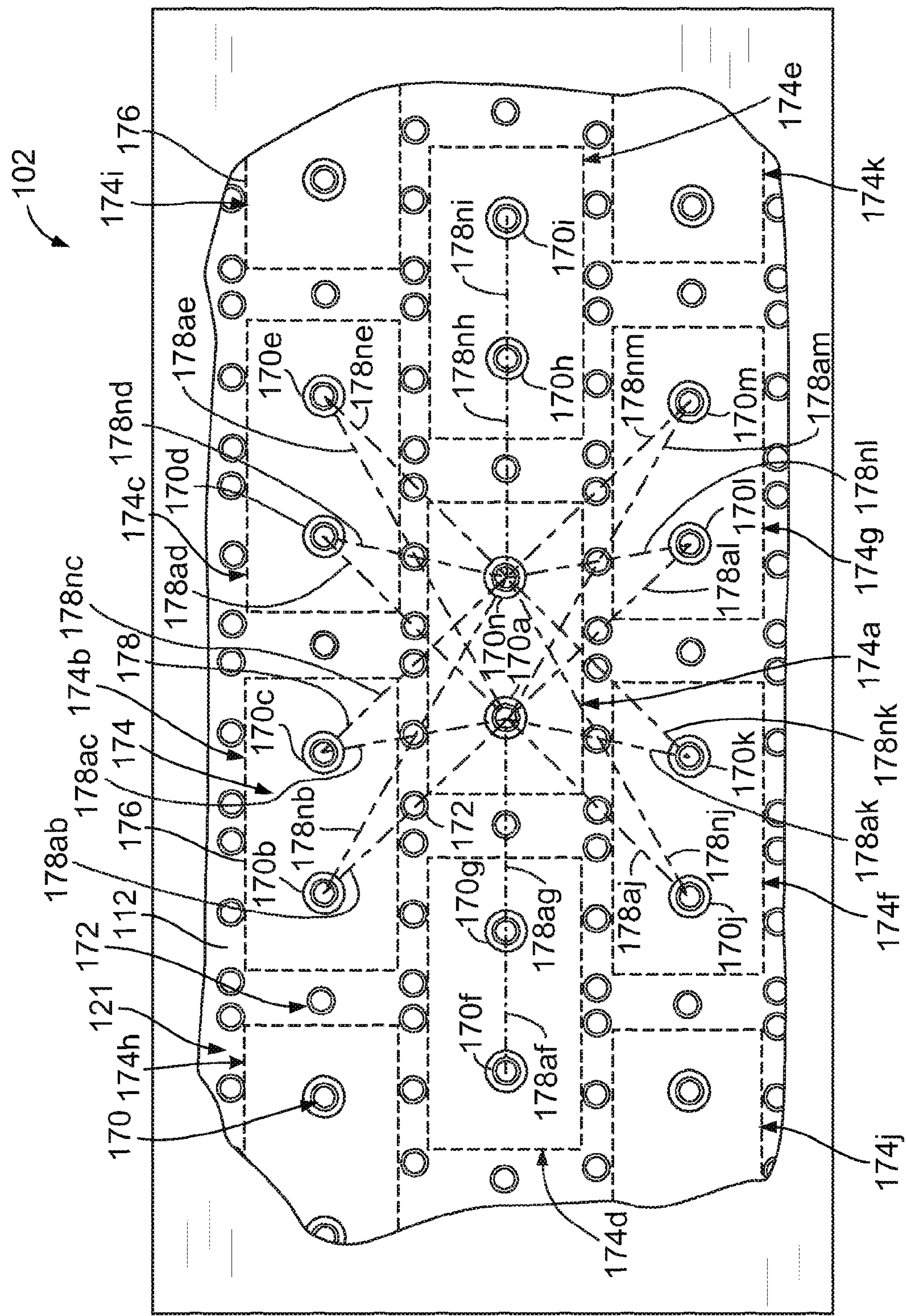
FIG. 4 is a plan view of a portion of an exemplary embodiment of a midplane printed circuit of the connector assembly shown in FIG. 1.

FIG. 3 is a perspective view of an exemplary embodiment of the header connector 106. The header connector 106 includes a dielectric housing 142 having a mating end 144 and a mounting end 146. The mating end 144 receives the receptacle connector 104 (FIG. 2). The mounting end 146 is mounted on the midplane printed circuit 102 (FIGS. 1 and 4). The housing 142 includes a pair of opposed shroud walls 148 and a pair of opposed shroud walls 150. Guide slots 152 are provided on the shroud walls 150. The guide slots 152 receive the guide ribs 132 (FIG. 2) of the receptacle connector 104 to orient the receptacle connector 104 with respect to the header connector 106. The header connector 106 holds a plurality of signal contacts 126 and ground contacts 128. But, the header connector 106 may additionally include electrical power contacts. In the exemplary embodiment, the signal and ground contacts 126 and 128, respectively, are press fit into the housing 142. In addition or alternative to the press-fit installation, the signal and ground contacts 126 and 128, respectively, may be held by the housing 142 using any other method, means, and/or structure.

The signal and ground contacts 126 and 128, respectively, each include a respective mating end 154 and 156 and a respective mounting end 158 and 160. The mating ends 154 and 156 are each sized and shaped to be received within a corresponding one of the contact channels 124 (FIG. 2) of the receptacle connector 104. When the connectors 104 and 106 are mated together, the mating ends 154 and 156 engage the mating contacts (not shown) of the receptacle connector 104 within the contact channels 124. The mounting ends 158 and 160 mount the header connector 106 to the midplane printed circuit 102 (FIGS. 1 and 4). Specifically, the mounting ends 158 and 160 are mounted in corresponding vias 170 and 172 (FIG. 4) of the midplane printed circuit 102. In the exemplary embodiment, each mounting end 158 and 160 is positioned to be received in a respective via 170 and 172 that is shared by the mounting end 166 (FIG. 1) of a corresponding electrical contact 168 (FIG. 1) of the header connector 108. That is, the mounting ends 158 and 160 extend into opposite ends of the same respective via 170 and 172 as the mounting end 166 of the corresponding electrical contact 168 of the header connector 108.

In the exemplary embodiment, the header connectors 106 and 108 are optionally substantially identical to one another. The header connector 108 will therefore not be described in more detail herein.

FIG. 4 is a plan view of a portion of an exemplary embodiment of the midplane printed circuit 102. The midplane printed circuit 102 includes the substrate 121, which includes the side 112 and the opposite side 114 (FIG. 1). The side 112 of the substrate 121 is illustrated in FIG. 4. The substrate 121 includes a plurality of signal vias 170 and a plurality of ground vias 172 that extend at least partially through the substrate 121. Specifically, each signal via 170 and each ground via 172 extends through at least one of the sides 112 and 114 and at least partially through the substrate 121 therebetween. In the exemplary embodiment, each of the signal vias 170 and each of the ground vias 172 extends through both sides 112 and 114 and completely through the substrate 121 therebetween.

The signal vias 170 and the ground vias 172 are arranged in an exemplary pattern along the substrate 121. The pattern of the signal vias 170 and the ground vias 172 may be referred to herein as a "footprint" of the midplane printed circuit 102. In the exemplary embodiment of FIG. 4, the signal vias 170 are arranged in differential pairs 174. The signal vias 170 of each differential pair 174 are positioned within a signal via zone 176. Each signal via zone 176 is bounded by ground vias 172 that are arranged around the signal vias 170 of the corresponding differential pair 174. The boundaries of the signal via zones 176 are indicated by phantom lines in FIG. 4. As can be seen in FIG. 4, no ground vias 172 are positioned within the signal via zones 176. In some embodiments, the signal via zones 176 are ground layer anti-pads that "keep out" ground layers to prevent signal vias 170 from shorting. A size of the signal via zones 176 may be selected to provide a predetermined impedance.

In the exemplary pattern shown in FIG. 4, the differential pairs 174 include a differential pair 174*a* and a plurality of differential pairs 174*b*, 174*c*, 174*d*, 174*e*, 174*f*, 174*g*, 174*h*, 174*i*, 174*j*, and 174*k* that are arranged in a pattern around the differential pair 174*a*. Only a portion of each of the differential pairs 174*h*, 174*i*, 174*j*, and 174*k* is shown in FIG. 4. Although eleven are shown, the substrate 121 may include any number of the differential pairs 174. Moreover, the substrate 121 may include any number of the signal vias 170 and any number of the ground vias 172. The differential pair 174*a* may be referred to herein as a "differential signal pair", while each of the differential pairs 174*b-k* may be referred to herein as a "differential aggressor pair". The signal vias 170 of the differential signal pairs 174*b-k* may be referred to herein as "aggressor vias". The term "aggressor" may be used herein to describe a signal via 170, or a differential pair 174 of signal vias 170, that may electrically interfere with other neighboring signal vias 170 and/or other neighboring differential pairs 174.

A linear path 178 is defined between each signal via 170 and each other signal via 170. In other words, a straight line can be drawn from each signal via 170 to each other signal via 170. The linear paths 178 are indicated by phantom lines in FIG. 4. Only some of the linear paths 178 are shown in FIG. 4. In the exemplary embodiment, each linear path 178 extends from a center of one of the corresponding signal vias 170 to a center of the other corresponding signal via 170. Alternatively, one or more of the linear paths 178 extends from a different location on at least one of the two corresponding signal vias 170 than the center. The differential pairs 174*b-g* are directly adjacent the differential pair 174*a*, while the differential pairs 174*h-k* are remote from, and not directly adjacent, the differential pair 174*a*. A given two differential pairs 174 are directly adjacent if there is not another differential pair 174 that extends between the two differential pairs 174. For example, a given two differential pairs 174 are directly adjacent if there is not another signal via zone 176 that extends between the two differential pairs 174. In some embodiments, a given two differential pairs 174 are directly adjacent if there is not another differential pair 174 that is intersected by the linear paths 178 between the signal vias 170 of the two differential pairs 174. For example, in some embodiments, a given two differential pairs 174 are directly adjacent if there is not another signal via zone 176 that is intersected by the linear paths 178 between the signal vias 170 of the two differential pairs 174.

As can be seen in FIG. 4, the ground vias 172 are arranged in a pattern around the differential pairs 174. At least one ground via 172 is positioned along each linear path 178 between the signal vias 170 of the differential pair 174*a* and the signal vias 170 of each differential pair 174 that is directly adjacent to the differential pair 174*a*. In other words, each linear path 178 between the signal vias 170 of the differential pair 174*a* and each directly adjacent differential pair 174 intersects a ground via 172. For example, a linear path 178*ab* extends from a signal via 170*a* of the differential pair 174*a* to a signal via 170*b* of the directly adjacent differential pair 174*b*. As can be seen in FIG. 4, the linear path 178*ab* intersects one of the ground vias 172. Similarly, a linear path 178*ac* extends from the signal via 170*a* to the other signal via 170*c* of the directly adjacent differential pair 174*b*. The linear path 178*ac* also intersects one of the ground vias 172. The other differential pairs 174*c*, 174*d*, 174*e*, 174*f*, and 174*g* that are directly adjacent the differential pair 174*a* include respective signal via pairs 170*d* and 170*e*, 170*f* and 170*g*, 170*h*, and 170*i*, 170*j* and 170*k*, and 170*l* and 170*m*. Linear paths 178*ad*, 178*ae*, 178*af*, 178*ag*, 178*aj*, 178*ak*, 179*al*, and 178*am* extend from the signal via 170*a* to the respective signal vias 170*d*, 170*e*, 170*f*, 170*g*, 170*j*, 170*k*, 170*l*, and 170*m*. Each linear path 178*ad*, 178*ae*, 178*af*, 178*ag*, 178*aj*, 178*ak*, 179*al*, and 178*am* intersects one of the ground vias 172.

In addition to the signal via 170*a*, the differential pair 174*a* includes a signal via 170*n*. A linear path 178*nb* extends from the signal via 170*n* to the signal via 170*b* of the directly adjacent differential pair 174*b*. The linear path 178*nb* intersects one of the ground vias 172. A linear path 178*nc* extends from the signal via 170*n* to the other signal via 170*c* of the directly adjacent differential pair 174*b*. The linear path 178*nc* also intersects one of the ground vias 172. Linear paths 178*nd*, 178*ne*, 178*nh*, 178*ni*, 178*nj*, 178*nk*, 179*nl*, and 178*nm* extend from the signal via 170*n* to the respective signal vias 170*d*, 170*e*, 170*f*, 170*g*, 170*j*, 170*k*, 170*l*, and 170*m*. As can be seen in FIG. 4, each linear path 178*nd*, 178*ne*, 178*nh*, 178*ni*, 178*nj*, 178*nk*, 179*nl*, and 178*nm* intersects one of the ground vias 172.

The ground vias 172 that are intersected by the linear paths 178 facilitate electrically isolating the signal vias 170*a* and 170*n* of the differential pair 174*a* from the signal vias 170 of each directly adjacent differential pair 170*b-g*. In the exemplary embodiment, only the differential pair 174*a* is described herein as having ground vias 172 positioned along each linear path 178 between the signal vias 170*a* and 170*b* thereof and the signal vias 170 of each directly adjacent differential pair 174*b-g*. But, in addition or alternative to the differential pair 174*a*, any other differential pair 174 of the midplane printed circuit 102 may have ground vias 172 positioned along each linear path 178 between the signal vias 170 thereof and the signal vias 170 of each directly adjacent differential pair 174. Moreover, the midplane printed circuit 102 may include any number of differential pairs 174 that have ground vias 172 positioned along each linear path 178 between the signal vias 170 thereof and the signal vias 170 of each directly adjacent differential pair 174. Although the linear paths 178 are each shown and described herein as each intersecting only a single ground via 172, each linear path 178 may intersect any number of ground vias 172. As shown herein, the linear paths 178 intersect centers of the corresponding ground vias 172. But, each linear path 178 may intersect any portion of the corresponding ground via(s) 172.

The pattern of signal vias 170, ground vias 172, and differential pairs 174 shown in FIG. 4 is meant as exemplary only. The signal vias 170, the ground vias 172, and the differential pairs 174 may be arranged in any other pattern so long as at least one differential pair 174 has ground vias 172 positioned along each linear path 178 between the signal vias 170 thereof and the signal vias 170 of each directly adjacent differential pair 174. In the exemplary embodiment, the pattern of the signal vias 170, the ground vias 172, and the differential pairs 174 on the side 112 of the substrate 121 is optionally substantially identical to the pattern on the side 114 of the substrate 121. The side 114 of the substrate 121 will therefore not be described in more detail herein.

Although each of the signal vias 170 shown in FIG. 4 is arranged in a differential pair 174, the midplane printed circuit 102 is not limited thereto. Rather, one or more of the signal vias 170 of the midplane printed circuit 102 may not be arranged in a differential pair. In such embodiments wherein one or more of the signal vias 170 is not arranged in a differential pair, one or more of the signal vias 170 may have ground vias 172 positioned along each linear path 178 between the signal via 170 and other signal vias 170 that are directly adjacent thereto. A signal via that is not arranged in a differential pair 174 is positioned within a signal via zone 176 that is bounded by ground vias 172 arranged around the signal via 170. No ground vias 172 are positioned within the signal via zone 176. A given two signal vias 170 are directly adjacent if there is not another signal via 170 that extends between the two signal vias 170. For example, a given two signal vias 170 are directly adjacent if there is not another signal via zone 176 that extends between the two signal vias 170. In some embodiments, a given two signal vias 170 are directly adjacent if there is not another signal via 170 that is intersected by the linear path 178 between the two signal vias 170. For example, in some embodiments, a given two signal vias 170 are directly adjacent if there is not another signal via zone 176 that is intersected by the linear path 178 between the two signal vias 170.

FIG. 5 is a plan view of a portion of an exemplary embodiment of the mounting end 146 of the header connector 106. The mounting ends 158 and 160 of the signal and ground contacts 126 and 128, respectively, are arranged in an exemplary pattern along the mounting end 146 of the housing 142. In the exemplary embodiment of FIG. 5, the mounting ends 158 of the signal contacts 126 are arranged in differential pairs 274. The mounting ends 158 of each differential pair 274 are positioned within a signal contact zone 276. Each signal contact zone 276 is bounded by ground contact mounting ends 160 that are arranged around the mounting ends 158 of the corresponding differential pair 274. The boundaries of some of the signal contact zones 276 are indicated by phantom lines in FIG. 5. Phantom lines showing the remaining boundaries have been omitted for clarity. As can be seen from the boundaries shown in FIG. 5, no ground contact mounting ends 160 are positioned within the signal contact zones 276.

In the exemplary pattern shown in FIG. 5, the differential pairs 274 include a differential pair 274*a* and a plurality of differential pairs 274*b*, 274*c*, 274*d*, 274*e*, 274*f*, 274*g*, 274*h*, 274*i*, 274*j*, and 274*k* that are arranged in a pattern around the differential pair 274*a*. Only a portion of each of the differential pairs 274*h*, 274*i*, 274*j*, and 274*k* is shown in FIG. 5. Although eleven are shown, the header connector 106 may include any number of the differential pairs 274. Moreover, the header connector 106 may include any number of the signal contacts 126 and any number of the ground contacts 128. The differential pair 274*a* may be referred to herein as a "differential signal pair", while each of the differential pairs 274*b*-*k* may be referred to herein as a "differential aggressor pair". The signal contacts 126 of the differential signal pairs 274*b*-*k* may be referred to herein as "aggressor contacts". The term "aggressor" may be used herein to describe a signal contact 126, or a differential pair 274 of signal contacts 126, that may electrically interfere with other neighboring signal contacts 126 and/or other neighboring differential pairs 274.

A linear path 278 is defined between each mounting end 158 of the signal contacts 126 and each other mounting end 158. In other words, a straight line can be drawn from each mounting end 158 to each other mounting end 158. The linear paths 278 are indicated by phantom lines in FIG. 5. Only some of the linear paths 278 are shown in FIG. 5. In the exemplary embodiment, each linear path 278 extends from a center of the corresponding mounting end 158 to a center of the other corresponding mounting end 158. Alternatively, one or more of the linear paths 278 extends from a different location on at least one of the two corresponding mounting ends 158 than the center. The differential pairs 274*b*-*g* are directly adjacent the differential pair 274*a*, while the differential pairs 274*h*-*k* are remote from, and not directly adjacent, the differential pair 274*a*. A given two differential pairs 274 are directly adjacent if there is not another differential pair 274 that extends between the two differential pairs 274. For example, a given two differential pairs 274 are directly adjacent if there is not another signal contact zone 276 that extends between the two differential pairs 274. In some embodiments, a given two differential pairs 274 are directly adjacent if there is not another differential pair 274 that is intersected by the linear paths 278 between the mounting ends 158 of the two differential pairs 274. For example, in some embodiments, a given two differential pairs 274 are directly adjacent if there is not another signal contact zone 276 that is intersected by the linear paths 278 between the mounting ends 158 of the two differential pairs 274.

The mounting ends 160 of the ground contacts 128 are arranged in a pattern around the differential pairs 274. At least one ground contact mounting end 160 is positioned along each linear path 278 between the mounting ends 158 of the differential pair 274*a* and the mounting ends 158 of each differential pair 274 that is directly adjacent to the differential pair 274*a*. In other words, each linear path 278 between the mounting ends 158 of the differential pair 274*a* and each directly adjacent differential pair 274 intersects a ground contact mounting end 160.

The ground contact mounting ends 160 that are intersected by the linear paths 278 facilitate electrically isolating the mounting ends 158 of the differential pair 274*a* from the mounting ends 158 of each directly adjacent differential pair 270*b*-*g*. In the exemplary embodiment, only the differential pair 274*a* is described herein as having ground contact mounting ends 160 positioned along each linear path 278 between the mounting ends 158 thereof and the mounting ends 158 of each directly adjacent differential pair 270*b*-*g*. But, in addition or alternative to the differential pair 274*a*, any other differential pair 274 of the header connector 106 may have ground contact mounting ends 160 positioned along each linear path 278 between the mounting ends 158 thereof and the mounting ends 158 of each directly adjacent differential pair 274. Moreover, the header connector 106 may include any number of differential pairs 274 that have ground contact mounting ends 160 positioned along each linear path 278 between the mounting ends 158 thereof and the mounting ends 158 of each directly adjacent differential pair 274. Although the linear paths 278 are each shown and described herein as each intersecting only a single ground contact mounting end 160, each linear path 278 may intersect any number of ground contact mounting ends 160. As shown herein, the linear paths 278 intersect centers of the corresponding ground contact mounting ends 160. But, each linear path 278 may intersect any portion of the corresponding ground contact mounting end(s) 160.

The pattern of mounting ends 158, the mounting ends 160, and the differential pairs 274 shown in FIG. 5 is meant as exemplary only. The mounting ends 158, the mounting ends 160, and the differential pairs 274 may be arranged in any other pattern so long as at least one differential pair 274 has ground contact mounting ends 160 positioned along each linear path 278 between the mounting ends 158 thereof and the mounting ends 158 of each directly adjacent differential pair 274. In the exemplary embodiment, the pattern of the mounting ends 158, the mounting ends 160, and the differential pairs 274 on the header connector 106 is optionally substantially identical to the pattern on the header connector 108. The header connector 108 will therefore not be described in more detail herein.

Although each of the mounting ends 158 shown in FIG. 5 is arranged in a differential pair 274, the header connector 106 is not limited thereto. Rather, one or more of the mounting ends 158 of the header connector 106 may not be arranged in a differential pair. In such embodiments wherein one or more of the mounting ends 158 is not arranged in a differential pair, one or more of the mounting ends 158 may have ground contact mounting ends 160 positioned along each linear path 278 between the mounting end 158 and other mounting ends 158 that are directly adjacent thereto. A mounting end 158 not arranged in a differential pair 274 is positioned within a signal contact zone 276 that is bounded by ground contact mounting ends 160 arranged around the mounting end 158. No ground contact mounting ends 160 are positioned within the signal contact zone 276. A given two mounting ends 158 are directly adjacent if there is not another mounting end 158 that extends between the two mounting ends 158. For example, a given two mounting ends 158 are directly adjacent if there is not another signal contact zone 276 that extends between the two mounting ends 158. In some embodiments, a given two mounting ends 158 are directly adjacent if there is not another mounting end 158 that is intersected by the linear path 278 between the two mounting ends 158. For example, in some embodiments, a given two mounting ends 158 are directly adjacent if there is not another signal contact zone 276 that is intersected by the linear path 278 between the two mounting ends 158.

The embodiments described and/or illustrated herein may provide a printed circuit footprint having reduced signal degradation.

Although the subject matter described and/or illustrated herein is described and illustrated with respect to the connector assembly 100 illustrated in FIG. 1, it is to be understood the benefits of the subject matter described and/or illustrated herein are applicable to any other connector system that includes a printed circuit. Moreover, the subject matter described and/or illustrated herein is not limited to use with the midplane printed circuit 102. Rather the subject matter described and/or illustrated herein may be used with the printed circuits 117 and/or 119.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the above description and the drawings. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A printed circuit comprising:

a substrate having a pair of opposite sides;

a pair of signal vias extending through at least one of the sides and at least partially through the substrate between the sides, the signal vias being arranged in a differential signal pair;

aggressor vias extending through at least one of the sides and at least partially through the substrate between the sides, the aggressor vias being arranged in differential aggressor pairs that are arranged in a pattern around the differential signal pair, wherein linear paths are defined between each of the signal vias of the differential signal pair and the aggressor vias of each differential aggressor pair, each linear path extending from a center of the corresponding signal via of the differential signal pair to a center of the corresponding aggressor via, at least some of the differential aggressor pairs being arranged along the substrate directly adjacent the differential signal pair; and ground vias extending through at least one of the sides and at least partially through the substrate between the sides, the ground vias being arranged around the differential signal pair, at least one ground via being positioned along each linear path between the signal vias of the differential signal pair and the aggressor vias of each of the differential aggressor pairs that is directly adjacent the differential signal pair.

2. The printed circuit according to claim 1, wherein no other differential aggressor pairs are positioned along the linear paths between the signal vias and the aggressor vias of the differential aggressor pairs that are directly adjacent the differential signal pair.

3. The printed circuit according to claim 1, wherein the differential signal pair is positioned within a signal via zone that is bounded by ground vias that extend around the differential signal pair, each differential aggressor pair being positioned within an aggressor via zone that is bounded by ground vias that extend around the differential aggressor pair, wherein no other aggressor via zones extend between the signal via zone and aggressor via zones that are directly adjacent the signal via zone.

4. The printed circuit according to claim 1, wherein the printed circuit comprises a midplane for interconnecting a pair of electrical connectors on the opposite sides of the substrate.

5. The printed circuit according to claim 1, wherein the printed circuit comprises a backplane for an electrical connector.

6. The printed circuit according to claim 1, wherein each linear path extends through a center of the at least one ground via that is positioned therealong.

* * * * *